United States Patent [19]
Sakaguchi et al.

[11] Patent Number: 6,150,194
[45] Date of Patent: Nov. 21, 2000

[54] SEMICONDUCTOR DEVICE SEALED WITH RESIN, AND ITS MANUFACTURE

[75] Inventors: Noboru Sakaguchi; Yoshinori Miyajima; Toru Hizume, all of Nagano, Japan

[73] Assignee: Shinko Electric Industries Co., Ltd., Nagano, Japan

[21] Appl. No.: 09/117,551

[22] PCT Filed: Dec. 4, 1997

[86] PCT No.: PCT/JP97/04450

§ 371 Date: Jul. 30, 1998

§ 102(e) Date: Jul. 30, 1998

[87] PCT Pub. No.: WO98/25302

PCT Pub. Date: Jun. 11, 1998

[30] Foreign Application Priority Data

Dec. 4, 1996 [JP] Japan ..................... 8-324082

[51] Int. Cl.[7] ........................ H01L 21/44; H01L 21/48; H01L 21/50
[52] U.S. Cl. .......................... 438/118; 438/126
[58] Field of Search ..................... 438/118, 126

[56] References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,258,330 | 11/1993 | Khandros et al. | 437/209 |
| 5,390,844 | 2/1995 | DiStefano et al. | 228/180 |
| 5,398,863 | 3/1995 | Grube et al. | 228/106 |
| 5,489,749 | 2/1996 | DiStefano et al. | 174/261 |
| 5,891,758 | 4/1999 | Honda et al. | |

FOREIGN PATENT DOCUMENTS

| | | |
|---|---|---|
| 4-84452 | 3/1992 | Japan . |
| 8-37345 | 2/1996 | Japan . |
| 8-83818 | 3/1996 | Japan . |
| WO 96/09746 | 3/1996 | WIPO . |

OTHER PUBLICATIONS

International Search Report.

*Primary Examiner*—John F. Niebling
*Assistant Examiner*—Josetta Jones
*Attorney, Agent, or Firm*—Pennie & Edmonds LLP

[57] ABSTRACT

A semiconductor device is provided which is capable of improving the productivity, the reliably, and the shielding of exposed parts such as leads or others and preventing chipping. The semiconductor device comprises a semiconductor chip 10, an insulating member 20 adhered onto an electrode terminal-forming surface 10a of a semiconductor chip 10, a circuit pattern 30 having at one end a land 32 to be connected to an external connection terminal, provided on the insulating member 20, and at the other end a lead 34 to be connected to an electrode terminal 12, a cover member 52 having an outer size larger than that of the semiconductor chip 10 to cover not only the electrode terminal-forming surface 10a and the lead 34 but also the outer edge of the semiconductor chip 10, and a resin shield 50 formed by filling a resinous sealant into a gap between the electrode terminal-forming surface 10a and the cover member 52 and curing the same, which shields the electrode terminal-forming surface 10a, the lead 34 and a side surface of the semiconductor chip 10.

4 Claims, 10 Drawing Sheets

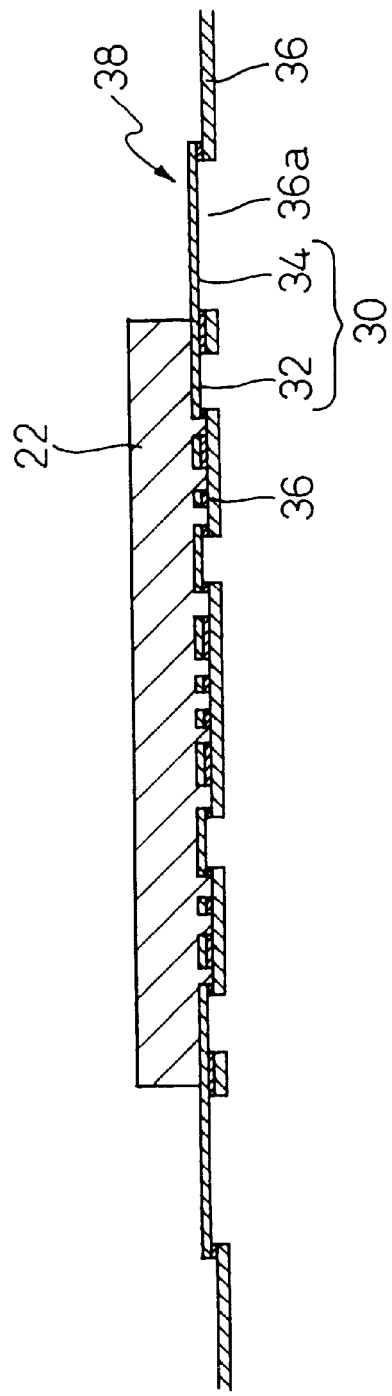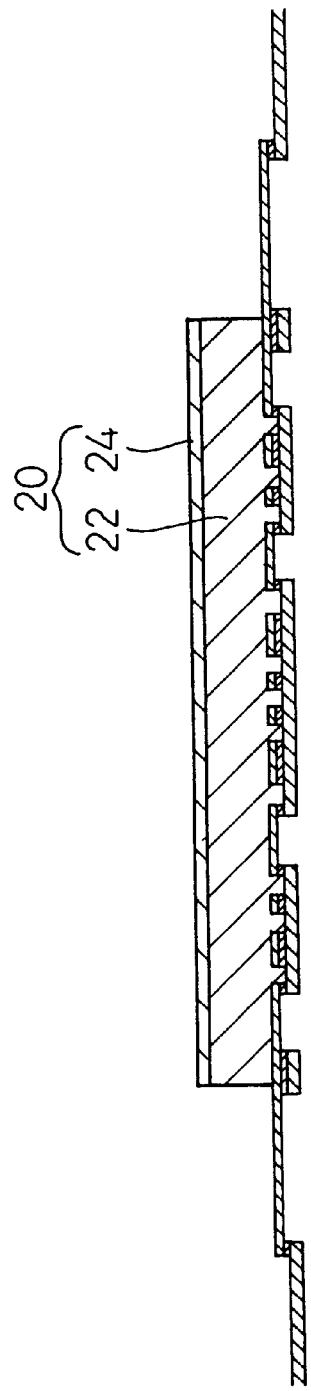

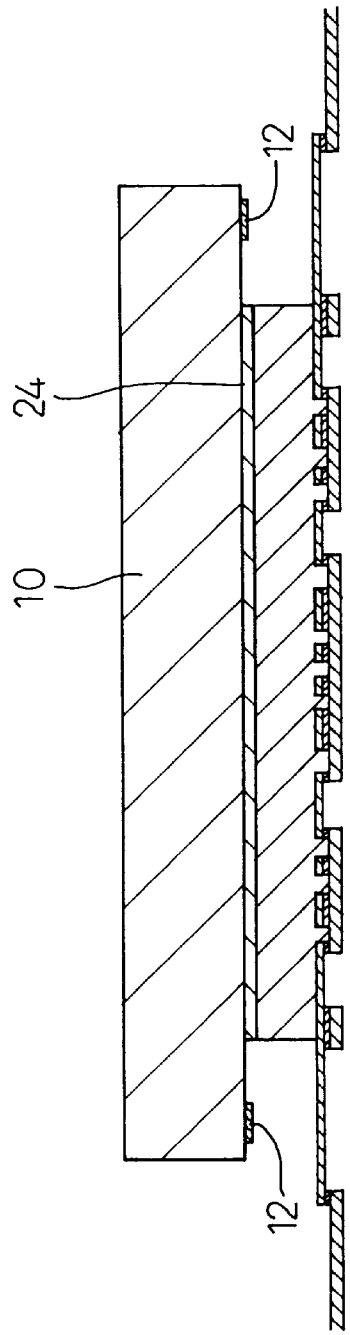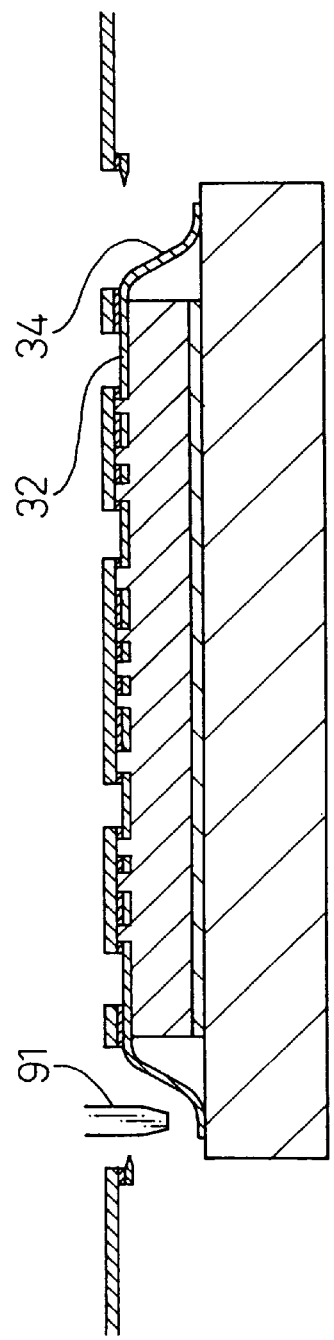

SEMICONDUCTOR DEVICE SEALED WITH RESIN, AND ITS MANUFACTURE

FIELD OF THE TECHNOLOGY

The present invention relates to a resin-shield type semiconductor device and a method of the production thereof.

BACKGROUND OF THE INVENTION

There are some products, having generally the same size as that of a semiconductor chip, in a semiconductor device formed by shielding the semiconductor chip with resin. In such a semiconductor device, a surface of the semiconductor chip on which electrode terminals are formed is shielded and external connection terminals are arranged thereon for connecting the chip to a circuit board so that the resultant device has the same size as that of the semiconductor chip (chip scale).

FIG. 14 shows a sectional view of a prior art semiconductor device having a chip size, in which the connection between a lead 34 and an electrode terminal 12 of a semiconductor chip 10 and the support for an external connection terminal (solder ball) 40 are illustrated. This semiconductor device is structured as follows:

An insulating member 20 is adhered onto a surface 10a of the semiconductor chip 10 on which the electrode terminal 12 is formed, without covering the electrode terminal 12. The insulating member 20 has a main layer of elastomer 22 and is adhered to the semiconductor 10 via an adhesive 24. A circuit pattern 30 has a land 32 at one end for the connection to the external connection terminal, and a lead 34 which is a conductive layer at the other end. The circuit pattern 30 is supported by an insulating film 36 which constitutes, together with the circuit pattern 30, a tape substrate 38. The tape substrate 38 is adhered to the insulating member 20 in the land 32 and connected to the electrode terminal 12 in the lead 34 by a bonding.

After the lead 34 is bonded, an exposed portion of the lead 34 and the electrode terminal 12 is shielded with resin 90. The circuit pattern 30 is adhered to the insulating film 36 by an adhesive 35. The external connection terminal is a solder ball 40 or the like and is connected to the land 32.

To constitute the above-mentioned lamination, first, the tape substrate 38 is formed, to which the elastomer 22 carrying the adhesive layer 24 is then adhered. With such an adhesive layer 24 the semiconductor chip 10 is adhered (see FIG. 2 in which a production method is illustrated).

FIG. 15 shows the bonding of the lead 34 to the electrode terminal 12. When the lead 34 is bonded, as illustrated, a bonding tool 91 comes into contact with a top surface of the lead 34 and pricks the lead 34 supported by the insulating film 36, while pushing the lead 34 by a front end of the bonding tool 91. The lead 34 is bent thereby to be in contact with the electrode terminal 12 and is bonded thereto. According to this bonding operation, the lead 34 is curved from the tape substrate 38 toward the electrode terminal 12 as illustrated. The bonding operation of the bonding tool 91 is a hot-press bonding while using ultrasound or another method.

FIG. 16 is an enlarged perspective view of the semiconductor chip 10 on which the tape substrate 38 is arranged. The lead 34 is supported to bridge over a window 36a provided in the insulating film 36. The tape substrate 38 is positioned so that the electrode terminal 12 of the semiconductor chip 10 is exposed in correspondence to the window 36a and the lead 34 is located above the respective electrode terminal 12. After the bonding tool 91 is pushed down from a position above a cutting point of the lead 34 and cuts the lead 34, the bonding tool 91 slides from the cutting point down to the electrode 12 (bonding point) to bond the lead 34 to the electrode terminal 12. The bonding operation is carried out by the bonding tool 91, one by one, on all the leads 34 as illustrated.

In the prior art, after the lead 34 is bonded as described above, a resin is coated along the outer edge of the semiconductor chip 10 through a dispenser to shield the exposed portions of the lead 34 and the electrode terminal 12.

However, in this prior art, it is difficult to properly coat the shield resin since the width of the area to be shielded is small. Further, to obtain a favorable finish, it is necessary to carry out the shielding operation at a lower speed to avoid dropping the resin, which results in a deterioration in productivity.

If the resin is not sufficiently coated, a cut end 34a or a shoulder 34b of the lead 34 may be exposed to lower the reliability of the resultant semiconductor device.

On the other hand, if the shield resin is excessively applied, the outer dimensions of the product become improper for the handling in the subsequent process.

Also, since a corner 10c of the semiconductor chip 10 is exposed and liable to chip off (chipping), the handling thereof is difficult.

DISCLOSURE OF THE INVENTION

Accordingly, an object of the present invention is to provide a semiconductor device, and a method for producing the same, improved in productivity and capable of assuredly shielding exposed portions of leads or others and avoiding chipping.

To achieve the above object, according to the present invention, a resin shield type semiconductor device is provided, comprising a semiconductor chip having an electrode terminal on an electrode terminal-forming surface, an insulating member adhered onto the electrode terminal-forming surface of the semiconductor chip without covering the electrode terminal, a circuit pattern having at one end a terminal to be connected to an external connection terminal, provided on the insulating member, and at the other end a lead to be connected to the electrode terminal, a cover member having an outer size larger than that of the semiconductor chip to cover not only the electrode terminal-forming surface and the lead but also the outer edge of the semiconductor, and a resin shield for shielding the electrode terminal-forming surface, lead and a side surface of the semiconductor chip, formed by filling a sealant into a gap between the cover member and the electrode terminal-forming surface and curing the sealant.

Preferably, the outer side surface of the resin shield is defined by cutting the same at a position outside of the outer edge of the semiconductor chip.

The insulating member is preferably an elastomer to allow it to absorb the difference in the thermal expansion coefficient between the circuit board and the semiconductor chip, resulting in an improvement in the reliability of the resultant product.

The circuit pattern is adhered to an insulating film and the lead initially bridging over an opening formed in the insulating film is pushingly cut by a bonding tool and bonded to the electrode terminal, whereby a chip-size semiconductor device is effectively produced.

The lead is connected to the electrode terminal provided on the outer edge of the semiconductor chip, and part of the insulating film located outside of an area wherein the lead is provided and the lead left in the insulating film define an outer edge corner of the resin shield, whereby the semiconductor device is suitably positioned, for example, when it is inserted into a test socket.

The lead is connected to the electrode terminal arranged in a central region of the semiconductor chip and the insulating film arranged outer than the semiconductor chip defines the outer edge corner of the resin shield, whereby even a semiconductor device of a center-row type is suitably positioned, for example, when it is inserted into a test socket.

According to another aspect, a resin shield type semiconductor device is provided, comprising a semiconductor chip having a plurality of electrode terminals on an electrode terminal-forming surface, a first insulating member adhered to the electrode terminal-forming surface without covering the electrode terminals, a first circuit pattern having at one end a first terminal to be connected to an external connection terminal, provided on the first insulating member, and at the other end a lead to be connected to at least one of the electrode terminals, a support member having a surface flush with the electrode terminal-forming surface of the semiconductor chip, a second insulating member adhered to the surface of the support member in a similar manner as the first insulating member, a second circuit pattern having at one end a second terminal to be connected to the external connection terminal, provided on the second insulating member and at the other end a lead to be connected to at least one of the electrode terminals, a cover member having a larger outer size than that of a composite body to cover not only the electrode terminal-forming surface and the first and second leads but also the outer edge of the composite body consisting of the semiconductor and the support member, and a resin shield for shielding the electrode terminal-forming surface, the first and second leads and a side surface of the composite body, formed by filling a sealant into a gap between the cover member and the composite body and curing the sealant, whereby even a semiconductor device of a hybrid semiconductor device of a fan-in/fan-out type is suitably positioned, for example, when it is inserted into a test socket.

The support member may have an annular shape, encircling the semiconductor chip or a can shape having a recess for mounting the semiconductor chip, whereby it is possible to properly arrange an external connection terminal and protect the semiconductor chip.

The cover member is preferably removed after the resin shield has been formed, so that the resultant semiconductor device is not thickened.

Since the cover member is a heat release tape, the productivity is facilitated.

Also, if the cover member is left together with the resin shield or others, the cover member is used as a protector for the semiconductor device to enhance the reliability of the resultant product.

According to a further aspect of the present invention, a method for producing a semiconductor device is provided, comprising the steps of adhering an insulating member on an electrode terminal-forming surface without covering an electrode terminal, connecting the electrode terminal to a lead formed at one end of a circuit pattern provided on the insulating member and having at the other end a terminal to be connected to an external connection terminal, attaching a cover member having a larger outer size than that of the semiconductor chip to cover not only the electrode terminal forming surface and the lead but also the outer edge of the semiconductor in an area outside a portion wherein the insulating member, the circuit pattern or others are laminated, so that a gap is defined between the electrode terminal-forming surface and the cover member, and filling a resinous sealant into the gap and curing the same, to form a resin shield.

BRIEF DESCRIPTION OF THE DRAWINGS

FIGS. 2(a) to 2(d) are illustrations for explaining the steps of a method for producing a first embodiment;

BEST MODES FOR CARRYING OUT THE INVENTION

Figure 1:
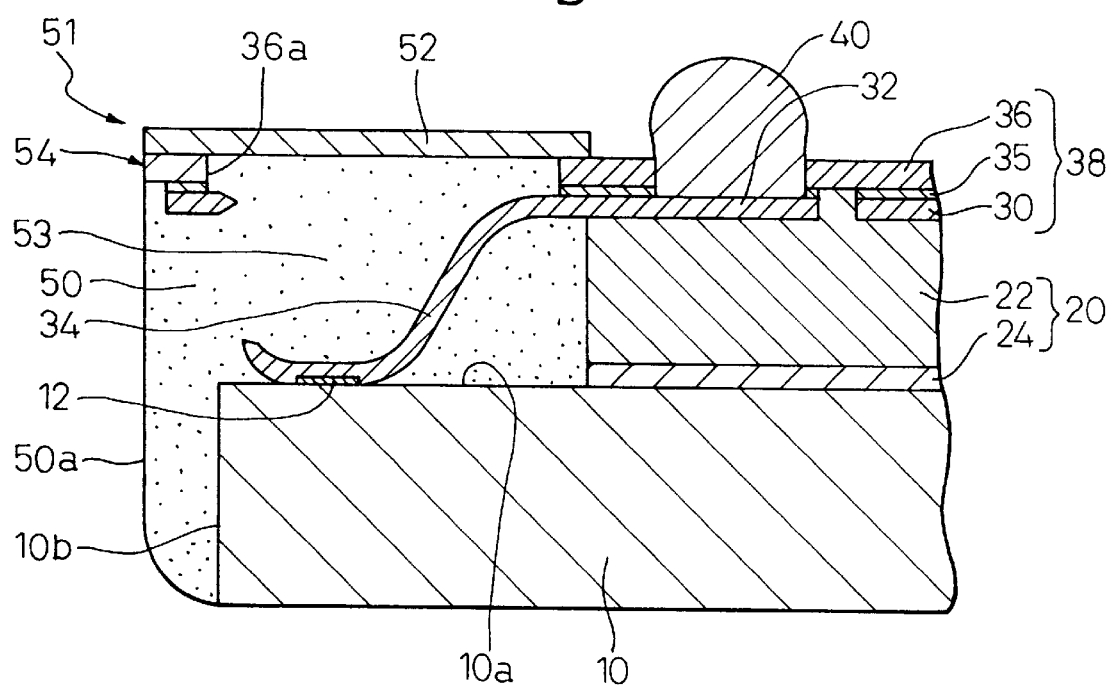
FIG. 1 is a sectional view of one embodiment of a semiconductor device according to the present invention.

A preferred aspect of the present invention will be explained below with reference to FIG. 1:

FIG. 1 is a sectional view of part of one embodiment of a semiconductor device according to the present invention.

A semiconductor chip 10 carries a plurality of electrode terminals 12 on one surface thereof (an electrode terminal-forming surface 10a).

An insulating member 20 is adhered to the electrode terminal-forming surface 10a of the semiconductor chip 10 without covering the electrode terminal 12. The insulating member 20 is formed of a main layer of elastomer 22 and adhered to the semiconductor chip 10 via an adhesive 24. The elastomer 22 operates as a shock absorber and is capable of absorbing the difference in thermal expansion coefficient between the circuit board and the semiconductor chip, whereby it enhances the reliability. To form the elastomer layer 22 on a tape substrate 38 described later, there may be a method wherein silicone resin is printed (for example, screen-printed) and cured or a method wherein a sheet-like adhesive is applied. The sheet-like adhesive (shock absorber) may be of a thermoplastic adhesive sheet of polyimide or polyolefin type elastomer or a sheet-like silicone elastomer or fluorine resin type elastomer.

If the elastomer 22 is self-adhesive, the adhesive a layer 24 may be eliminated.

A circuit pattern 30 has, at one end thereof, a land 32 which is a terminal to be connected to an external connection terminal (such as a solder ball 40) provided on the insulating member 20, and at the other end, a lead 34 which is an conductive layer connected to the electrode terminal 12.

The circuit pattern 30 is mounted to an insulating film 36 via an adhesive layer 35 except for the lead 34 and the land 32. Thereby, the circuit pattern 30 is held by the insulating film 36 which constitutes a tape substrate 38 together with the circuit pattern 30.

Figure 15:
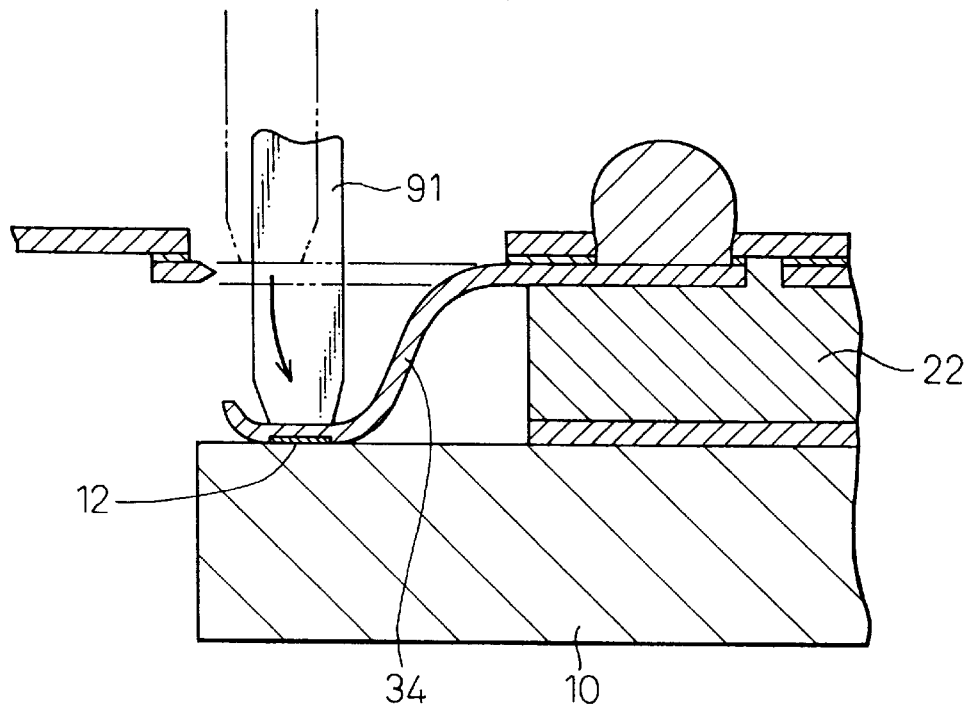
FIG. 15 is an illustration for explaining a method for producing the prior art semiconductor device.
Figure 16:
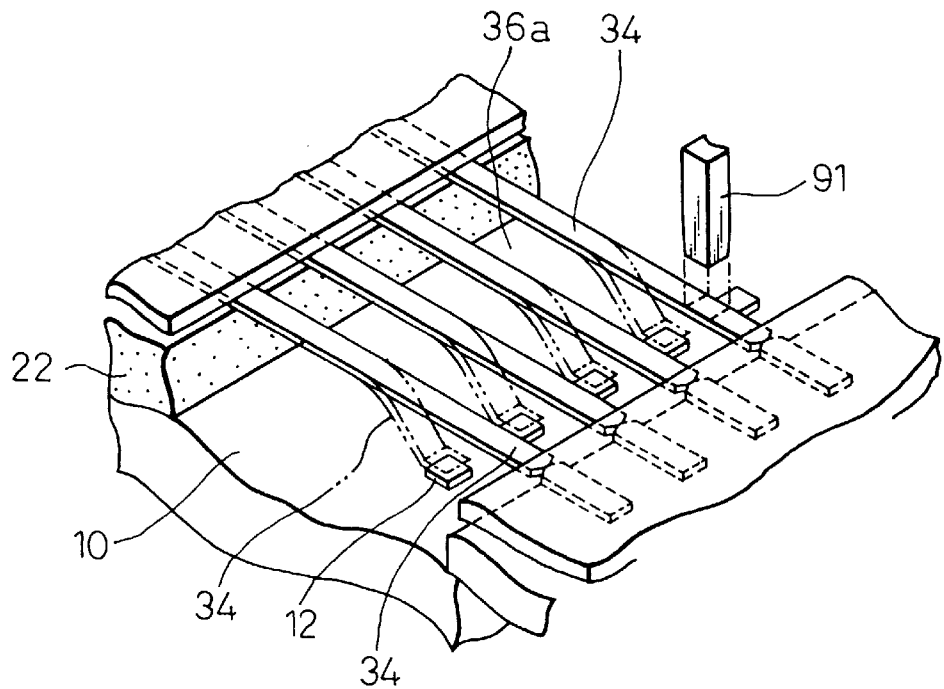
FIG. 16 is a perspective view for explaining the method for producing the prior art semiconductor device.

The lead 34 initially bridges over an opening 36a formed in the insulating film 36 and then is cut by a bonding tool and bonded to the electrode terminal 12 (see FIGS. 15 and 16). Thereby, a semiconductor device of a chip size is efficiently produced.

A resin shield 50 is formed by filling and curing a resin in a gap 53 between the electrode terminal-forming surface 10a and a cover member 52 so that the electrode terminal-forming surface 10a, the lead 34 and a lateral surface 106 of the semiconductor chip are shielded. An outer surface 50a of the resin shield is formed by cutting the shield at a position outside the outer edge of the semiconductor chip 10. The cover member 52 is formed to be larger in size than the semiconductor chip 10 so that it covers not only the electrode terminal-forming surface 10a and the lead 34 but also the outer edge of the semiconductor chip 10, and is adhered to an outer side of a portion where the insulating member 20, the circuit pattern 30 and the insulating film 36 are laminated together (that is, an outer surface of the tape substrate 38) so that the gap 53 is formed between the same and the electrode terminal-forming surface 10a. In this regard, the cover member 52 may be adhered to part of the tape substrate 38 while excluding the land 34, but may be adhered all over the latter if the cover member is removed after the resin shield 50 is formed.

The lead 34 is connected to the electrode terminal 12 provided on the outer edge of the semiconductor chip 10, and part of the insulating film 36 and the lead 34 left in a portion where the lead 34 has been provided forms a guide ring 54. The guide ring 54 defines an outer edge corner 51 of the resin shield. Thereby, it is possible to easily position the semiconductor device, for example, when it is inserted into a test socket for the inspection by using the guide ring 54 as an outer guide means.

(First Embodiment)

The structure of the embodiment shown in FIG. 1 will be described in detail and with reference to a method for the production the same based on the drawings.

First, one method for forming the tape substrate 38 will be explained below.

A copper film forming a conductive layer is laminated with the insulating film 36 to form a base sheet. The insulating film 36 is made of polyimide resin, epoxy resin, BT resin or others, or one surface of which is coated with an adhesive. After the opening 36a is punched out, the copper film which later forms the circuit pattern 30 is adhered to one surface of the insulating film 36. The opening 36a is an area where the lead 34 to be bonded to the electrode terminal 12 of the semiconductor chip 10 is formed to coincide with the arrangement of the electrode terminal 12 of the semiconductor chip 10. Such a structure is the same as a basic structure of TAB tape. Since the TAB tape is usable as the base sheet, the production cost can be reduced.

Then, the circuit pattern 30 (including the land 32 and the lead 34) is formed by the etching of copper foil. The land 32 is an area for bonding an external connection terminal such as a solder ball 40 or the like. The land 32 is provided as part of the circuit pattern 30 to have a size corresponding to that of the external connection terminal. Photolithography is adopted for forming the circuit pattern 30 through the etching of copper foil. A resist layer is formed on the surface of the copper foil and exposed while using a mask of a predetermined pattern, which then is developed to be a resist pattern solely exposing part of the copper foil to be removed later. The copper foil is etched while using the resist pattern as a mask. After the etching, the resist is removed and the circuit pattern 30 provided with the land 32 and the lead 34 is completed. As illustrated, the lead 34 is held while bridging over the opening 36a.

An electrolytic plating layer of nickel, palladium or gold is applied to the copper foil left after the etching (lead 34 or others). The electrolytic layer may be single or plural in accordance with the specification of the product. Thereby, the tape substrate 38 is formed in which the land 32 to be bonded to the solder ball 40 is exposed and the lead 34 bridges over the opening 36a.

A method for forming a semiconductor device by using the above-mentioned tape substrate 38 will be described with reference to FIG. 2.

First, the elastomer 22 is applied to a surface of the tape substrate 38 carrying the circuit pattern 30, and cured to form a layer having a predetermined thickness (see FIG. 2(a)).

An adhesive layer 24 is formed on the surface of the elastomer 22 by printing or the like (see FIG. 2(b)).

After the positioning of the tape substrate 38 carrying the elastomer layer 22 relative to the semiconductor chip 10, the semiconductor chip 10 is adhered via the adhesive 24 onto the tape substrate 38 positioned so that a surface to which the solder ball 40 is bonded is outside (see FIG. 2(c)). A portion of the adhesive 24 adhered to the semiconductor chip 10 is outside of an area wherein the electrode terminal 12 is provided, and therefore, it is possible to adhere the semiconductor chip 10 with the tape substrate 38 without covering the electrode terminal 12 with the adhesive.

After the tape substrate 38 is adhered to the semiconductor chip 10 via an adhesive member 20 (elastomer 22 and adhesive 24) in the above manner, the respective lead 34 is bonded to the electrode terminal 12 by a bonding tool 91 (see FIG. 2(d)). The steps described above are the same as those of the method already stated with reference to the background technology.

Figure 3A:
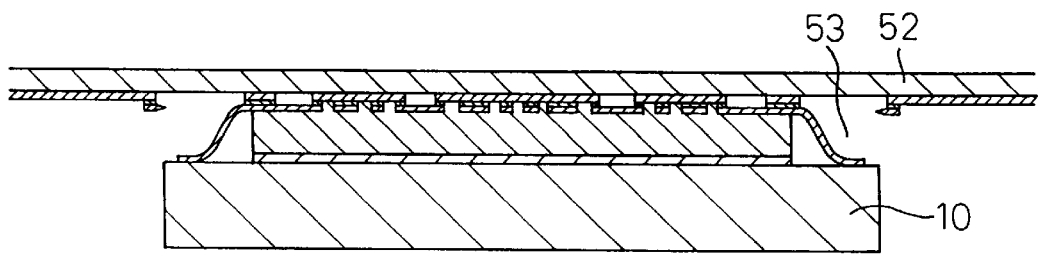
FIGS. 3(a) to 3(d) are illustrations for explaining the steps of a method for producing the first embodiment.

Then, the cover member 52 is arranged over the electrode terminal-forming surface 10a or the semiconductor chip 10 is arranged generally in parallel thereto to cover the latter, which member has a size somewhat larger than the outer size of the semiconductor chip 10, i.e., sufficient for covering at least the lead 34 of the circuit pattern 30 as well as the outer edge of the semiconductor chip 10 (see FIG. 3(a)). In this regard, the cover member 52 is adhered onto the tape substrate 38 while maintaining throughout the length a predetermined distance (a distance corresponding to a thickness of the insulating member 20 and the tape substrate 38) from the electrode terminal-forming surface 10a. That is, if the tape substrate 38 is maintained in a tensioned state, the semiconductor chip 10 may be placed on the outer surface of the tape substrate 38.

A heat release tape may be used as a cover member 52. The heat release tape is known as a thermo-peel tape, an adhesivity of which is lowered and liable to release when the temperature rises to a predetermined value.

Pressure bonding or vacuum bonding is suitably used for the bonding of the cover member 52.

Figure 3B:
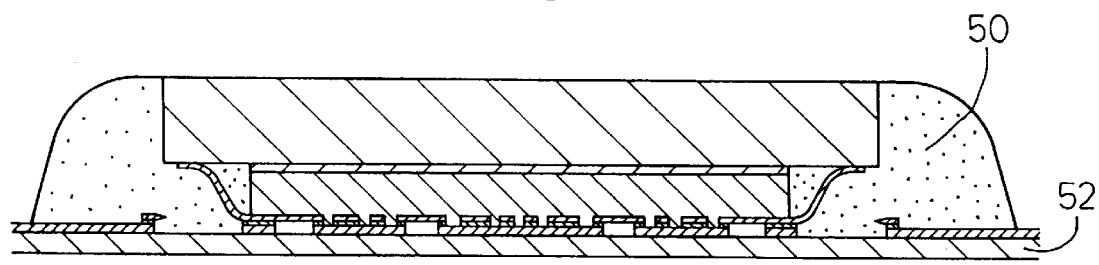

A resinous sealant is filled into the gap 53 between the cover member 52 and the electrode terminal-forming surface 10a of the semiconductor chip 10 and cured. (see FIG. 3(b)). After the sealant is injected around the semiconductor chip 10 by a dispenser, air is sucked out from the gap 53 (vacuum defoaming).

The sealant may be cured with heat if it is of a thermo-curable type. During this curing step, the cover member is simultaneously released if it is of a thermo-peel type, because the releasing temperature of the thermo-peel tape and the curing temperature of the sealant are generally at the same level. If the sealant is composed of silicone resin, this temperature is about 150° C.

As described above, it is possible to obtain a semiconductor device small in thickness by removing the cover member 50 after the resin shield 50 is formed. Also, it is possible to improve the productivity because the curing of the sealant and the releasing of the cover member 52 can be carried out in the same step if the cover member 52 is formed of a thermo-peel tape.

Figure 3C:
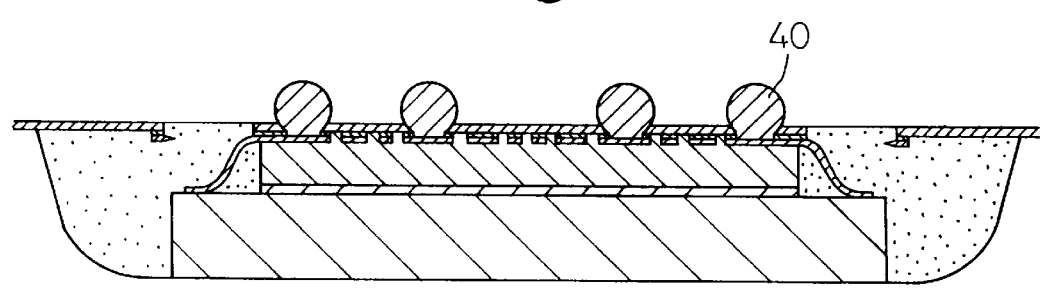

Next, the solder ball 40 is bonded (see FIG. 3(c)). First, a flux for enhancing the solder bonding is coated on the land 32 after the resinous sealant is filled and cured as described above, for example, by printing or transferring or the solder ball can be preliminarily applied with the flux. The solder ball 40 is placed on the land 32 and heated to be reflowed. After the solder ball 40 is bonded in such a manner, the flux is removed by rinsing.

Figure 3D:
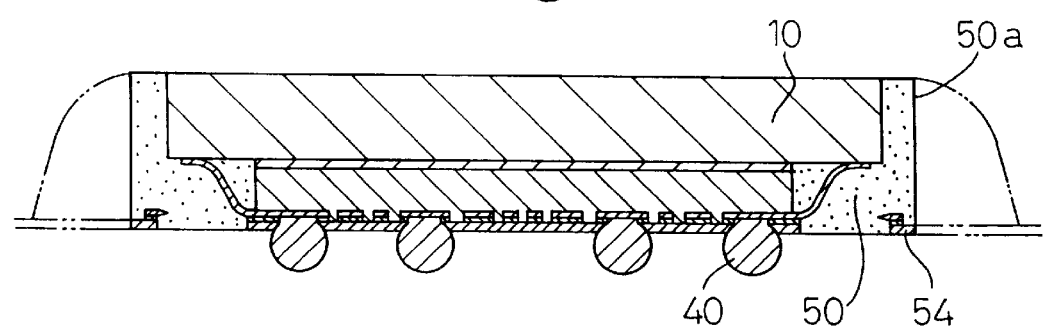

Then, the resin shield 50 formed of the cured resinous sealant is cut at a position outside the outer edge 106 of the semiconductor chip 10 so that part of the 31 resin shield 50 is left on the semiconductor (see FIG. 3(d)). Thus, a side surface 50a of the resin shield is formed. The cutting may be carried out by an NC cutter or a dicer, or by a punching using a die. In the above method, a sheet substrate is used for forming a plurality tape substrates 38. When the resin-shielded semiconductor devices are cut into individual devices by a punching, the respective semiconductor device is picked up from the remaining part of sheet substrate by a suction means provided in the die. Thus, the semiconductor device is completed.

The resin shield 50 may be cut at a position flush with a side surface 10b of the semiconductor chip 10 if the specification of the product allows. In such a case, while the side surface 10b of the semiconductor chip is not protected by the resin shield, the semiconductor chip 10 can be favorably protected in comparison with the background technology because the resin shield 50 of a suitable thickness is present even on the outer edge of the semiconductor chip 10.

Since the resin shield 50 is formed in the gap between the cover member 52 and the electrode terminal-forming surface 10a of the semiconductor chip 10, the lead 34 is completely shielded and the corner of the semiconductor chip 10 is also suitably covered. Accordingly, the exposure of the lead 34 as well as the chipping of the semiconductor device 10 are favorably prevented.

As apparent from the drawings, a guide ring 54 can be left in the resin shield 50 when the residual resin shield 50 is cut off. By the guide ring 54 thus left, it is possible to easily insert the resultant semiconductor device into a test socket. That is, since a corner of a bump surface on which the solder ball is fixed is formed to have an angular edge by the guide ring 54 having a relatively high hardness, the accuracy of an outer size thereof is enhanced and the insertion into the test socket becomes easier.

(Second Embodiment)

A second embodiment will be described with reference to FIG. 4 (illustrating the production thereof).

Figure 4A:
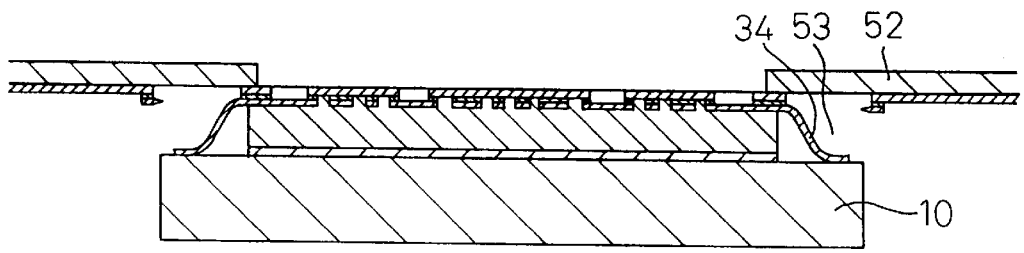
FIGS. 4(a) to 4(d) are illustrations for explaining the steps of a method for producing a second embodiment.
Figure 4B:
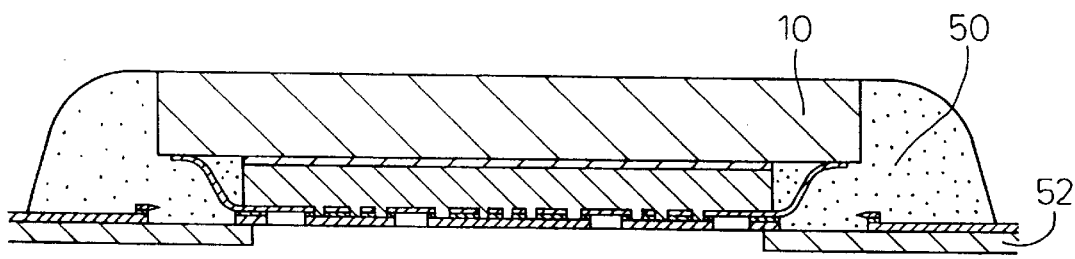
Figure 4C:
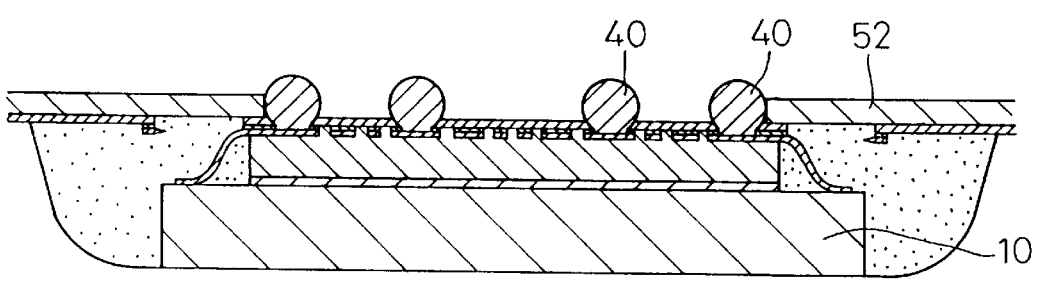

The cover member 52 is released from the semiconductor device during the production thereof according to the first embodiment. However, according to the second embodiment, the cover member 52 is left in the semiconductor device together with the resin shield 50. Therefore, the cover member 52 is not formed to cover all the semiconductor chip 10. Instead, it solely covers the lead 34 and has an opening in an area corresponding the land 32 to be able to mount the solder ball 40 or others, as shown in FIG. 4(a). After such a cover member 52 is applied, the lead 34 or others is shielded with the sealant to form the resin shield 50 in the same manner as in the first embodiment (see FIG. 4(b)). Then, the solder ball 40 is mounted (FIG. 4(c)), and then part of the resin shield 50 is cut off (FIG. 4(d)), resulting in the semiconductor device.

Figure 4D:
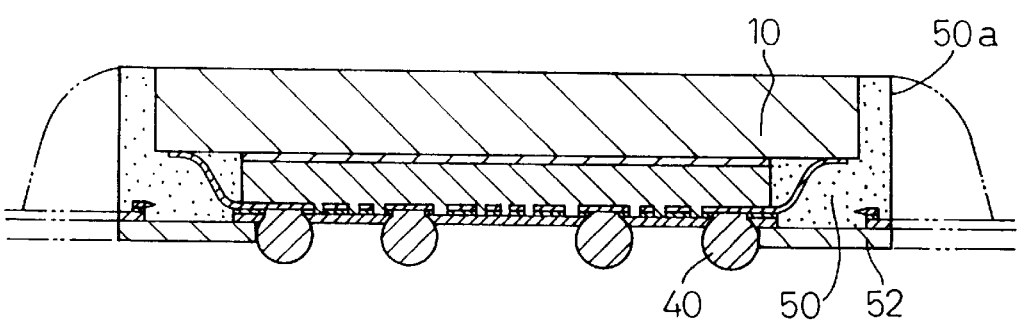

The cover member 52 having a good adhesivity to the resinous sealant is selectively employed so that the cover member 52 is left on the semiconductor device (see FIG. 4(d)). For example, a cover-lay film (polyimide film with adhesive) or a dry film solder resist may be used for this purpose. A laminate press is suitably used for the bonding of the cover member.

The cover member 52 left together with the resin shield 50 is used as a protector for the semiconductor device, whereby the reliability of the product is enhanced.

The cover member 52 may have an opening limited to an area corresponding to the land 32 in FIG. 4(a).

A sole difference of the process for producing the second embodiment from that of the first embodiment is in that the cover member 52 is not released.

(Third Embodiment)

Figure 5:
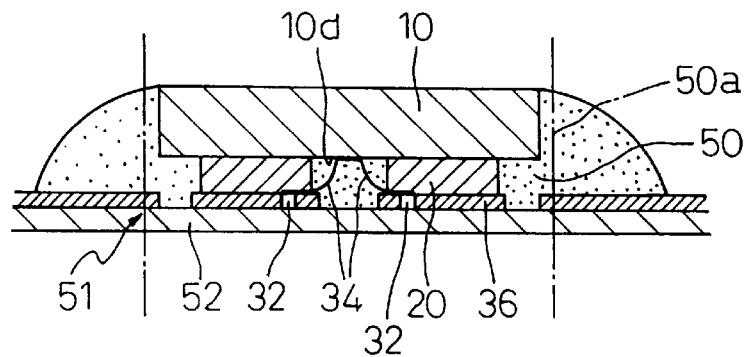
FIG. 5 is a sectional view of a third embodiment.
Figure 6:
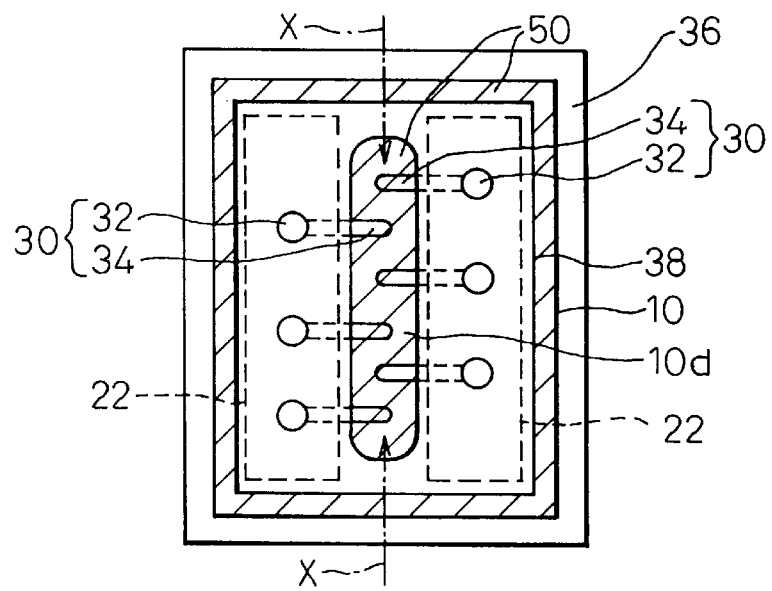
FIG. 6 is a plan view of a third embodiment.

A third embodiment will be described with reference to FIGS. 5 and 6 in which the same reference numerals are used for denoting the same parts, description of which will be eliminated here.

In the first and second embodiments, the electrode terminal 12 is provided in the vicinity of the periphery of the semiconductor chip 10 and the lead 34 of the circuit pattern 30 is bonded to the electrode terminal 12. However, the electrode terminal 12 of the semiconductor chip 10 is not always located in the peripheral region, but may be disposed in a central region of the semiconductor chip 10 (which is called a "center-row type" semiconductor chip). Also in such a case, the present invention is applicable.

As illustrated, in the third embodiment, the lead 34 is connected to the electrode terminal 12 provided in a central region 10d of the semiconductor chip 10. The insulating tape 36 of the tape substrate 38 has an opening at a position coinciding with that of the electrode terminal 12 so that the lead 34 is bonded to the electrode terminal 12 by the method described with reference to the first embodiment.

The cover member 52 covers the lead 34 connected to the electrode terminal 12 and the outer edge portion of the semiconductor chip 10. Thus, it is possible to fill the resinous sealant by a vacuum defoaming and shield the lead 34 or others. As shown in FIG. 6, the resinous sealant passes through a resin permeation path X which is a gap between two elastomers 22, 22 and enters the central region 10d in which the lead 34 is bonded.

The resin shield 50 is cut at a position outside of the outer edge of the semiconductor chip 10 so that the outer surface 50a of the resin shield 50 is formed, causing an outer shape capable of preventing chipping to be obtained in the same manner as the first embodiment.

Also, similar to the first embodiment, part of the insulating film 36 positioned outside the semiconductor chip 10 is left after the resin shield 50 is cut off, and defines the outer edge corner 51 of the resin shield 50. The outer edge corner 51 has a positioning function and enhances the insertion of the semiconductor device into the test socket even in a center-row type.

(Fourth Embodiment)

Figure 7:
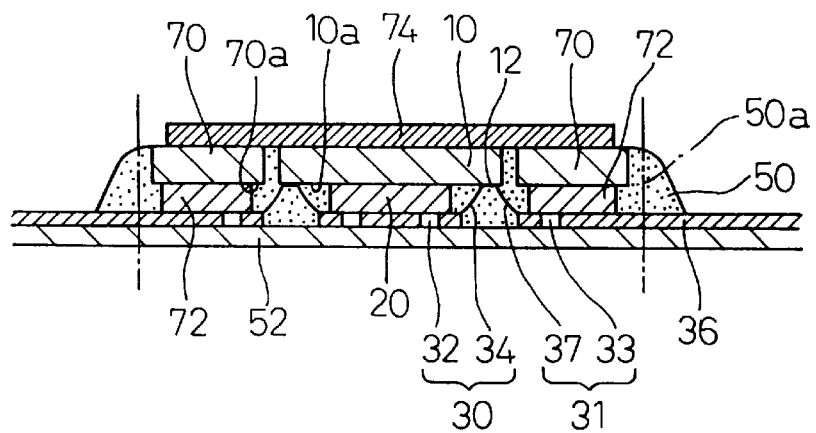
FIG. 7 is a sectional view of a fourth embodiment.
Figure 8:
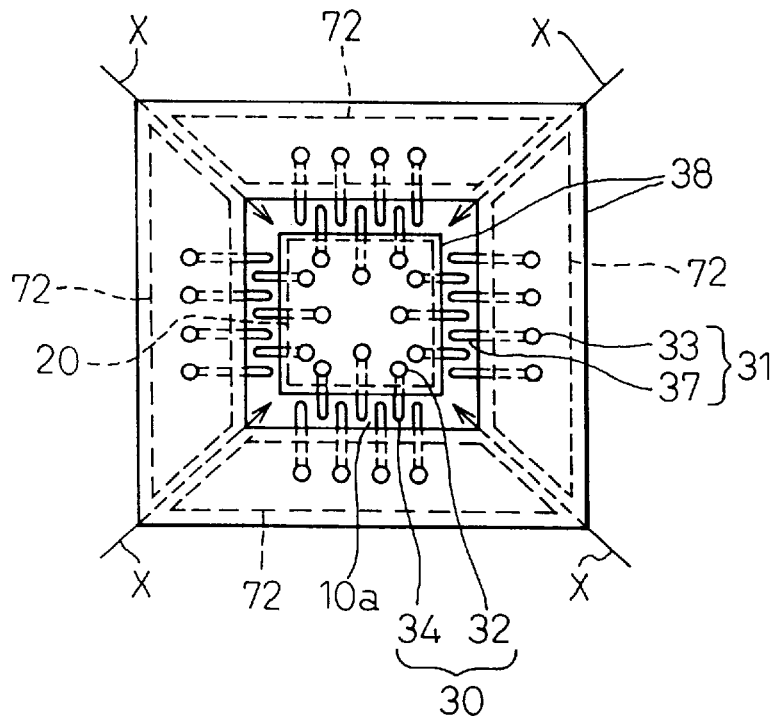
FIG. 8 is a plan view of the fourth embodiment.

A fourth embodiment will be described with reference to FIGS. 7 and 8 in which the same reference numerals are used for denoting the same parts, description of which will be eliminated here.

According to this embodiment, the present invention is suitably applied to a hybrid semiconductor device of a "fan-in type" (wherein a circuit extends inward) and a "fan-out type" (wherein a circuit extend outward), which structures will be described below.

A support member 70 of the same thickness as that of the semiconductor chip 10 has a surface 70a flush with the electrode terminal-forming surface 10a of the semiconductor chip. The support member 70 of this embodiment is formed in an annular shape to encircle the semiconductor chip 10. An insulating member 72 of the support member is adhered onto the support member 70. A circuit pattern 31 of the support member has a terminal (land 33) to be connected to the external connection terminal (solder ball 40) at one end, and a lead 37 to be connected to the electrode terminal 12 at the other end. A backing tape 74 is adhered to back surfaces of the semiconductor chip 10 and the support member 70 so that the both are suitably supported.

The cover member 52 has an outer shape larger than that of a composite body consisting of the semiconductor chip 10 and the support member 70 so that it covers not only the surface 70a and the leads 34, 37 of the circuit patterns 30 and 31 but also the outer edge of the composite body, and is adhered to the outer side surface of the tape substrate 38 to be positioned generally in parallel to the electrode terminal-forming surface 10a and the surface 70a of the support member.

A resinous sealant is filled in a gap between the electrode terminal-forming surface 10a as well as the surface 70a of the support member adjacent thereto and the cover member 52 and cured. It is possible to favorably shield the leads 34, 37 by filling the resinous sealant through vacuum defoaming. As shown in FIG. 8, the resinous sealant passes through four resin permeation paths X defined between every adjacent pairs of elastomer 72 arranged on the support member 70 and reaches the electrode terminal-forming surface 10a or others onto which the lead 34 is bonded.

Also, it is possible to produce the same effects as those of the first to third embodiments even in the hybrid semiconductor device of a fan-in/fan-out type if the resin shield 50 is cut off at a position outside of the outer edge of the composite body so that the outer side surface 50a is defined. For example, the chipping of the semiconductor device is prevented or the insertion thereof into the test socket is enhanced.

Figure 9A:
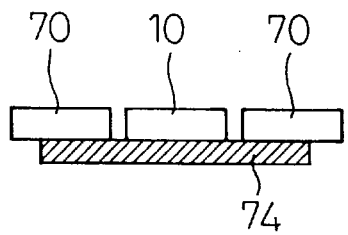
FIGS. 9(a) and 9(b) are illustrations for explaining the steps of a method for producing the fourth embodiment.
Figure 9B:
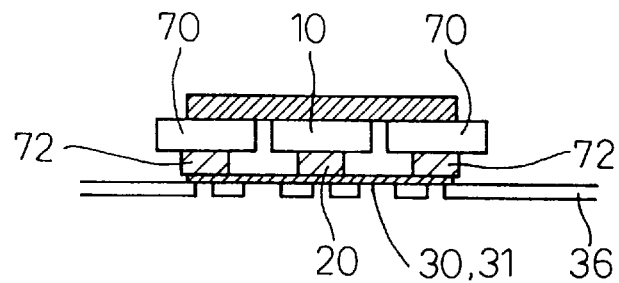

FIGS. 9(a) and 9(b) illustrate a method for producing the semiconductor device according to the fourth embodiment, particularly a step for connecting the semiconductor chip 10 with the annular support member 70. First, the semiconductor chip 10 is adhered to a central region of the adhesive surface of the backing tape 74 and then the annular support member 70 is adhered while encircling the semiconductor chip (see FIG. 9(a)). Then, the backing tape 74 is positioned upside down and connected to a tape substrate (consisting of a polyimide film 36 and circuit patterns 30, 31) to which the elastomer 72 is preliminarily attached. Thus, the semiconductor chip 10 is adhered to the insulating member 20, and the annular support member 70 to the elastomer 72, respectively.

Figure 10:
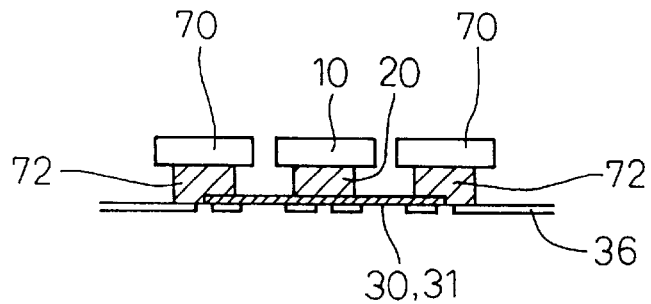
FIG. 10 is an illustration for explaining another method for producing the fourth embodiment.

FIG. 10 illustrates another method for connecting the semiconductor chip 10 to the annular support member 70. First, the semiconductor chip 10 is adhered to the tape substrate (consisting of a polyimide film 36 and leads 30, 31) to which the elastomer 72 (including the insulating member 20) is preliminarily adhered. Thus, the semiconductor chip 10 is adhered to the insulating member 20. Then, the annular support member 70 is adhered to the elastomer 72 on the tape substrate. Next, a backing tape (not shown in FIG. 10) is attached to back surfaces of the semiconductor chip 10 and the support member 70 for the purpose of fixing the both.

Figure 11:
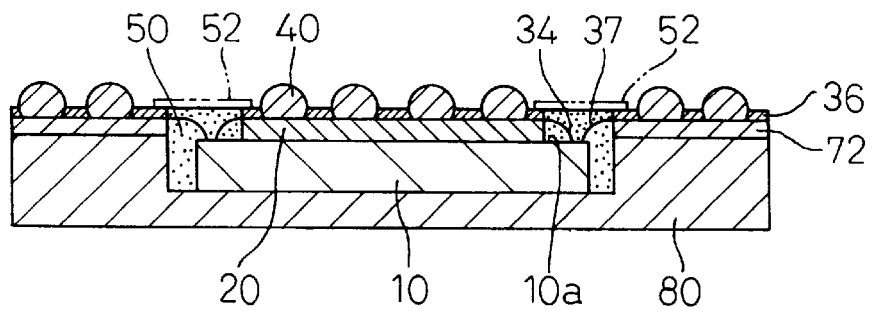
FIG. 11 is a sectional view of an embodiment wherein a can-like support is used.

In this regard, a support member of a can shape shown in FIG. 11 may be used instead of the annular support member. Reference numeral 80 denotes the can-shaped support member, and 52 denotes a cover member. The resin shield 50 is suitably formed by shielding the electrode terminal-forming surface 10a and the leads 34, 37 with a sealant.

Figure 12:
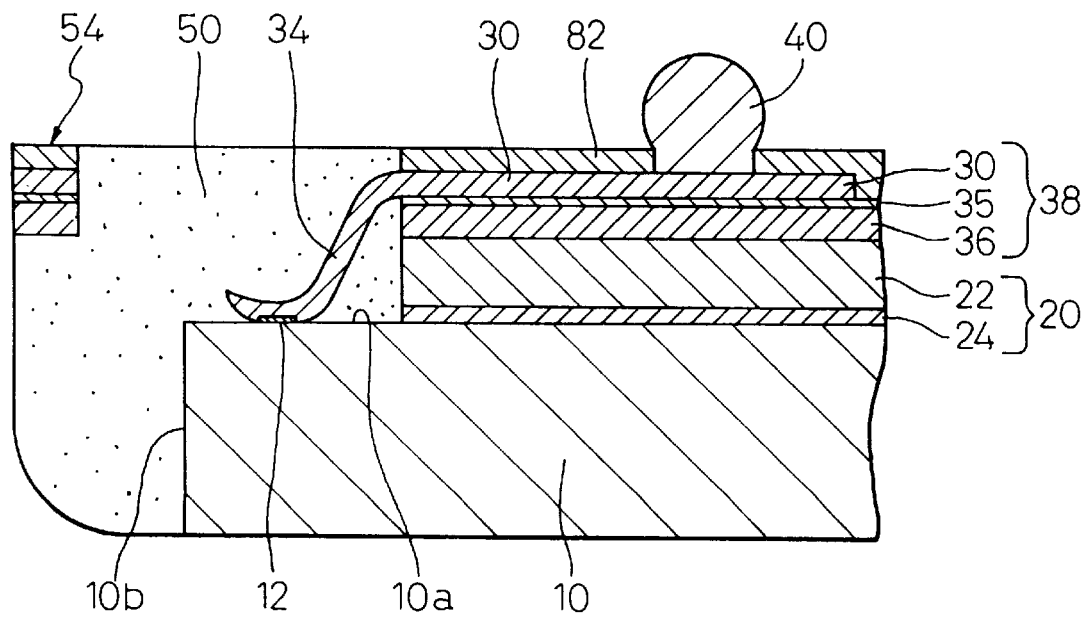
FIG. 12 is a sectional view of a further embodiment of the present invention.

In the above embodiments, the tape substrate 38 is used so that the lead 34 is supported on the inner side (semiconductor side) of the insulating film 36. However, the present invention is not limited thereto but is applicable also to a semiconductor device wherein, as shown in FIG. 12, the lead 34 is supported on the outer side of the insulating film 36 and the exposed circuit pattern 30 is covered with a solder resist 82.

In the above embodiments, the insulating member 20 includes the elastomer 22. However, the present invention is not limited thereto but the elastomer 22 may be eliminated if the conditions, under which the semiconductor device is used, allow. For example, in the embodiment shown in FIG. 12, the insulating film 36 is sufficiently operative as an insulating member even though the tape substrate 38 is directly adhered to the semiconductor chip 10 without the interposition of the elastomer 22. It is possible to reduce the production cost by eliminating the elastomer 22.

The tape substrate may also be adhered to the semiconductor chip by using the self-adhesive elastomer.

Figure 13:
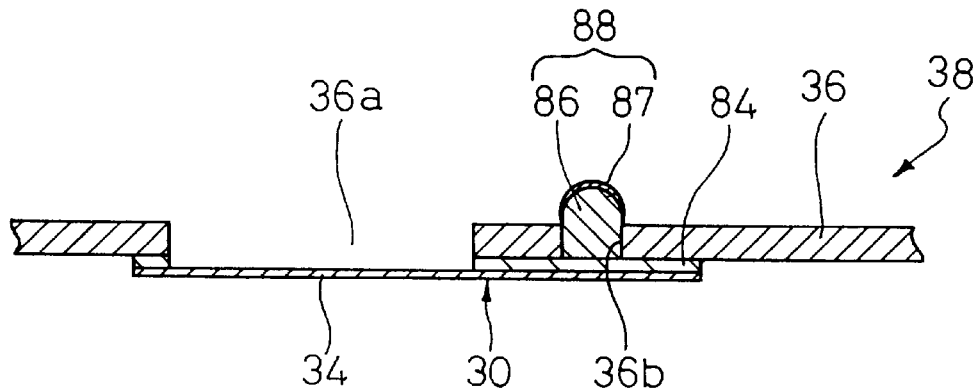
FIG. 13 is a sectional view of another embodiment of a tape substrate according to the present invention.
Figure 14:
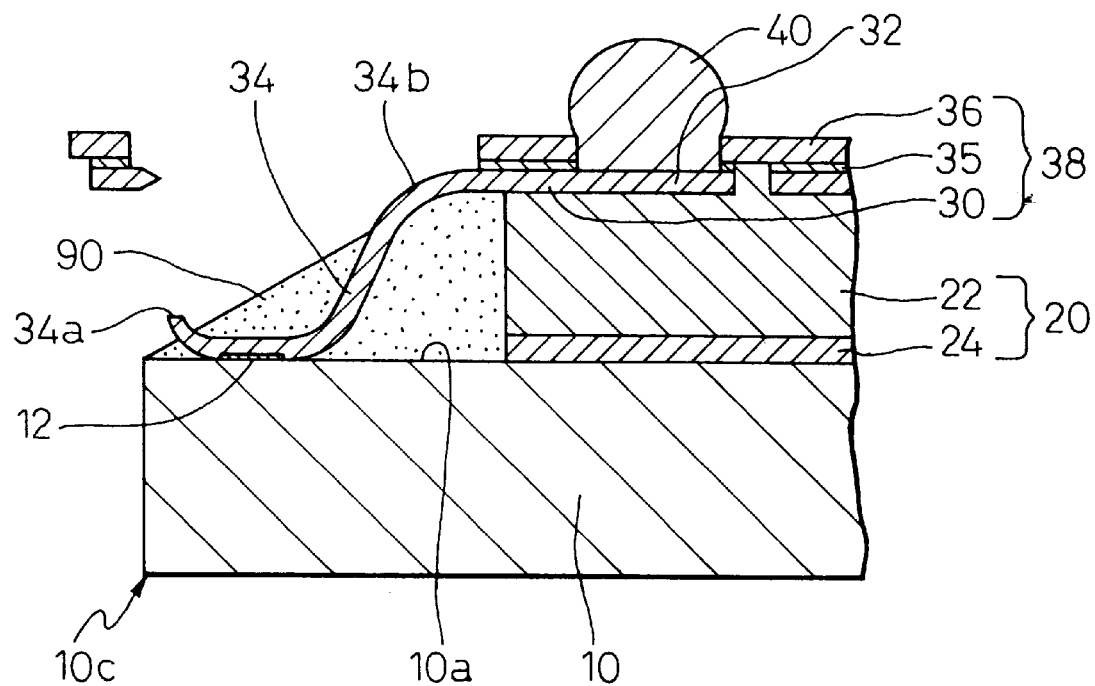
FIG. 14 is a sectional view of a prior art semiconductor device.

In the above embodiments, the copper foil is used for forming the circuit pattern 30. However, the present invention is not limited thereto, but the circuit pattern may be formed by a plating of gold. A method for forming the gold-plating circuit pattern will be described with reference to FIG. 13. First, a copper layer 84 is formed on the insulating film 36 by sputtering, vapor-deposition or electroless plating. After a resist pattern, from which a portion corresponding to a circuit pattern later defined is removed, has been formed on the copper layer 84, the circuit pattern 30 is formed by plating with gold. Then, the resist pattern is removed and an opening 36a for a bump is formed in the insulating film 36 by an etching or a laser machining. A bump 88 is formed by a nickel plating layer 86 and a gold plating layer 87. Then, similar to the above method, an opening 36a is formed in the insulating film 36. Copper exposed in the opening 36a is removed by an etching liquid for exclusively dissolving copper, resulting in the tape substrate 38. In such a manner, a lead 34 made of gold is obtainable.

While the present invention has been described with reference to various embodiments as stated above, it should not be limited thereto and many other variations and modifications are, of course, included without departing from the spirit of the present invention.

CAPABILITY OF EXPLOITATION IN INDUSTRY

According to the present invention, the resin shield is formed by filling the resinous sealant into the gap between the cover member and the electrode terminal forming surface of the semiconductor device and curing the same. By using the cover member, it is possible to fill the resinous sealant by a vacuum defoaming, resulting in a reliable and effective shielding compared with the conventional one carried out by merely using a dispenser. Also, it is possible to favorably form the resin shield and suitably protect the semiconductor chip.

Accordingly, the productivity is improved, the exposed portions such as leads or others are assuredly shielded and chipping is prevented to enhance the reliability.

What is claimed is:

1. A method for producing a semiconductor device, comprising the steps of:
    adhering an insulating member on an electrode terminal-forming surface without covering an electrode terminal;
    connecting the electrode terminal to a lead formed at one end of a circuit pattern provided on the insulating member and having at the other end a terminal to be connected to an external connection terminal;
    attaching a cover member having an outer size larger than that of the semiconductor chip to cover not only the electrode terminal-forming surface and the lead but also the outer edge of the semiconductor in an area outside a portion wherein the insulating member, the circuit pattern or others are laminated, so that a gap is defined between the electrode terminal-forming surface and the cover member; and
    filling a resinous sealant into the gap and curing the same to form a resin shield.

2. A method for producing a semiconductor device as defined by claim 1, wherein the cover member is removed after the resin shield has been formed.

3. A method for producing a semiconductor device , comprising the steps of:
    adhering an insulating member on an electrode terminal-forming surface without covering an electrode terminal;
    connecting the electrode terminal to a lead formed at one end of a circuit pattern provided on the insulating member and having at the other end a terminal to be connected to an external connection terminal;
    attaching a cover member having an outer size larger than that of the semiconductor chip to cover not only the electrode terminal-forming surface and the lead but also the outer edge of the semiconductor in an area outside a portion wherein the insulating member, the circuit pattern or others are laminated, so that a gap is defined between the electrode terminal-forming surface and the cover member;
    filling a resinous sealant into the gap and curing the same to form a resin shield; and
    cutting the resin shield at a position outside of an outer edge of the semiconductor chip to define an outer side surface of the resin shield.

4. A method as defined by claim 3, wherein said cover member is attached to said semiconductor chip so as to cover an outer surface of said insulating member, so that for a terminal-forming area of said terminal which is to be connected to the external connection terminal is exposed.

* * * * *